US011435840B2

(12) United States Patent
Garelli et al.

(10) Patent No.: US 11,435,840 B2
(45) Date of Patent: Sep. 6, 2022

(54) REMOTE CAPACITIVE INTERFACE

(71) Applicant: Apple Inc., Cupertino, CA (US)

(72) Inventors: Adam T. Garelli, Morgan Hill, CA (US); Senem E. Emgin, Mountain View, CA (US); Terrence L. Van Ausdall, Boulder Creek, CA (US); Antonio Clarke, Redwood City, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/207,329

(22) Filed: Mar. 19, 2021

(65) Prior Publication Data

US 2021/0208694 A1 Jul. 8, 2021

Related U.S. Application Data

(63) Continuation of application No. 16/444,938, filed on Jun. 18, 2019, now Pat. No. 10,955,934.
(Continued)

(51) Int. Cl.
  *G06F 3/039* (2013.01)
  *G06F 3/023* (2006.01)
  (Continued)

(52) U.S. Cl.
  CPC .......... *G06F 3/0393* (2019.05); *G06F 1/1616* (2013.01); *G06F 1/1669* (2013.01); *G06F 1/1681* (2013.01); *G06F 3/0231* (2013.01); *H01H 13/702* (2013.01); *H01R 13/22* (2013.01); *G06F 3/044* (2013.01); *G06F 2200/1639* (2013.01); *G06F 2203/0383* (2013.01); *H03K 2217/960725* (2013.01)

(58) Field of Classification Search
  CPC ...... G06F 3/0393; G06F 3/0416; G06F 3/041; G06F 3/04883; G06F 1/1626; G06F 3/04886; G06F 1/1662; G06F 3/044; G06F 3/016; G06F 1/1616; G06F 1/1632; G06F 3/0219; G06F 1/1669; G06F 3/02–0232; G06F 1/1633–1671
  See application file for complete search history.

(56) References Cited

U.S. PATENT DOCUMENTS 4,635,354 A    1/1987   Chrobak et al.
2004/0209489 A1  10/2004  Clapper
(Continued)

*Primary Examiner* — Sanjiv D. Patel
(74) *Attorney, Agent, or Firm* — Dorsey & Whitney LLP

(57) ABSTRACT

Computing devices, input devices, keyboard assemblies, and related systems include a set of conductive traces or leads configured to transfer a capacitive load from an appendage of a user or another capacitive load source from a remote location, such as on a keycap of the keyboard, to a conductive portion or electrode on the keyboard that is positioned near a touch-sensitive interface of a computing device. The capacitive load is thereby transferable through the conductive traces or leads to the touch-sensitive interface without having to directly apply the load, such as by touching a finger to the interface. This can reduce or eliminate the need for on-screen controls or keyboard interface elements in a touch screen device without having to use a more expensive and energy-draining wired or wireless connection between the computing device and a keyboard case or accessory for the computing device.

19 Claims, 8 Drawing Sheets

Related U.S. Application Data

(60) Provisional application No. 62/727,391, filed on Sep. 5, 2018.

(51) Int. Cl.
    *H01H 13/702*     (2006.01)
    *G06F 1/16*     (2006.01)
    *H01R 13/22*     (2006.01)
    *G06F 3/044*     (2006.01)

(56) References Cited

U.S. PATENT DOCUMENTS

| | | |
|---|---|---|
| 2010/0123676 A1 | 5/2010 | Kirkup |
| 2010/0302168 A1* | 12/2010 | Giancarlo ............... G06F 3/041 345/169 |
| 2011/0191505 A1 | 8/2011 | Wu |
| 2012/0180140 A1 | 7/2012 | Barrowman et al. |
| 2013/0335327 A1* | 12/2013 | Solomon ............... G06F 1/1669 345/168 |
| 2014/0168100 A1* | 6/2014 | Argiro .................... G06F 3/017 345/173 |
| 2014/0354305 A1* | 12/2014 | Hanssen ............. H03K 17/955 324/661 |
| 2015/0193008 A1 | 7/2015 | Bolender |
| 2018/0004304 A1 | 1/2018 | Moseley et al. |
| 2018/0103544 A1 | 4/2018 | Holbery et al. |
| 2018/0188774 A1 | 7/2018 | Ent et al. |
| 2019/0286247 A1 | 9/2019 | Barel et al. |
| 2020/0026387 A1* | 1/2020 | Barel .................... G06F 3/0416 |

* cited by examiner

REMOTE CAPACITIVE INTERFACE

CROSS-REFERENCE TO RELATED APPLICATION(S)

This application is a continuation of U.S. patent application Ser. No. 16/444,938, filed 18 Jun. 2019, and entitled "REMOTE CAPACITIVE INTERFACE," which claims priority to U.S. Provisional Patent Application No. 62/727,391, filed 5 Sep. 2018, and entitled "REMOTE CAPACITIVE INTERFACE," the disclosures of which are hereby incorporated by reference in their entireties.

FIELD

The described embodiments relate generally to interfaces for electronic devices. In some specific examples, the present embodiments relate to keyboards for touch screen devices.

BACKGROUND

Many electronic devices have keyboards and related devices to receive input and interaction from users. These electronic devices include computers, such as personal computers, tablet computers, and smartphones, and other "smart" devices, such as media players, video and audio equipment, vehicle consoles, home automation controllers, and related devices. Keyboards and other interface devices are designed with buttons or keys that are pressed by users to generate input signals for a processor or controller. These devices are often designed to provide a controlled amount of resistance to the user's fingertips in order to give tactile feedback as the user presses a button or key. The feel, sound, cost, and size of each button or key are tightly controlled to efficiently provide a desired user experience. Although some keyboards are "virtual," such as software keyboards displayed on a touchscreen device, it can be beneficial to provide key travel, or movement of the keys, to help the user more easily feel, see, and hear when and where a key is pressed and to provide an overall more satisfying interaction with the device.

Providing this type of key or button can come with costs. Touchscreen devices that do not have a built-in mechanical keyboard can be connected to a peripheral keyboard interface device, but that peripheral device must have an independent power source or must have a wired connection to the touchscreen device that can drain the power source of the touchscreen device or can require special electrical connectors to the peripheral device. Thus, there are many challenges and areas for improvements in interface devices.

SUMMARY

One aspect of the disclosure relates to a computing device and keyboard assembly. The computing device can have an external surface and a touch-sensitive interface. The keyboard can be removably coupled to the computing device, with the keyboard having a contact section and an input section. The contact section can contact the external surface of the computing device, wherein a set of conductive traces can extend through the contact section and the input section. Each conductive trace of the set of conductive traces can comprise a first conductive portion located in the contact section and a second conductive portion located in the input section. Application of a capacitive load to one of the second conductive portions of the set of conductive traces can be detectable by the touch-sensitive interface via the first conductive portion.

The computing device can be a tablet computer, and the keyboard can further comprise a set of switches arranged in a keyboard layout, with each switch of the set of switches being connected to a respective second conductive portion of the set of conductive traces. The capacitive load can be applied by an appendage of a user, and the set of switches can selectively enable or disable electrical communication between the capacitive load and the touch-sensitive interface via the respective second conductive portion.

The first conductive portions can contact the touch-sensitive interface. The touch-sensitive interface can comprise a display screen portion, wherein the first conductive portions of the set of conductive traces can overlap the display screen portion. The touch-sensitive interface can be positioned on the computing device external to a display screen of the computing device. The external surface can face away from the display screen of the computing device. The first conductive portions of the set of conductive traces can be distributed across an edge portion of the computing device. The computing device can be configured to detect a presence of the contact section of the keyboard against the external surface.

Another aspect of the disclosure relates to a keyboard, comprising a housing having a first section and a second section, with the first section having an external surface configured to face an electronic device and with the second section being configured to extend away from the electronic device. The keyboard can also include a set of conductive leads positioned in the housing, with each conductive lead of the set of conductive leads comprising a first conductive portion positioned at the external surface of the first section and configured to contact the electronic device and a second conductive portion positioned in the second section. The second conductive portions can be arranged in a keyboard layout, and each of the second conductive portions of the set of conductive leads can be configured to transfer capacitive loads to the respective first conductive portions.

The keyboard can further include a set of switches, wherein each switch of the set of switches can be connected to a separate second conductive portion of the set of conductive leads. The keyboard can also include a set of keys, wherein each key of the set of keys comprises a conductive input surface. The conductive input surfaces can be electrically connectable to a respective second conductive portion of the set of conductive leads via a respective switch of the set of switches. A capacitive load source can also be included, wherein each switch of the set of switches comprises a releasable connection to the capacitive load source. The capacitive load source can be located in the first section of the housing. A hinge can be positioned between the first and second sections of the housing.

In yet another aspect of the disclosure, a capacitive keyboard is provided that can include a set of conductive traces each having a first end and a second end and a set of keys each comprising a keycap and a switch, wherein each switch is respectively electrically connected to one of the second ends of the set of conductive traces. The switches can be respectively actuatable to transfer a capacitive load from a respective key of the set of keys to a respective first end of the set of conductive traces.

In some embodiments, each of the keycaps of the set of keys can comprise a conductive surface, wherein the capacitive load can be transferable from the conductive surface to the respective conductive trace. The keyboard can also have a housing, with the set of keys being positioned on the housing, and wherein each switch is electrically connected to a capacitive load source in the housing. The capacitive load source can be an electrical ground or can be a virtual ground when connected to a conductive trace of the set of conductive traces. The first ends of the set of conductive traces can be arranged in a staggered pattern.

BRIEF DESCRIPTION OF THE DRAWINGS

The accompanying drawings and figures illustrate a number of exemplary embodiments and are part of the specification. Together with the present description, these drawings demonstrate and explain various principles of this disclosure. A further understanding of the nature and advantages of the present invention can be realized by reference to the following drawings. In the appended figures, similar components or features can have the same reference label.

Figure 1:
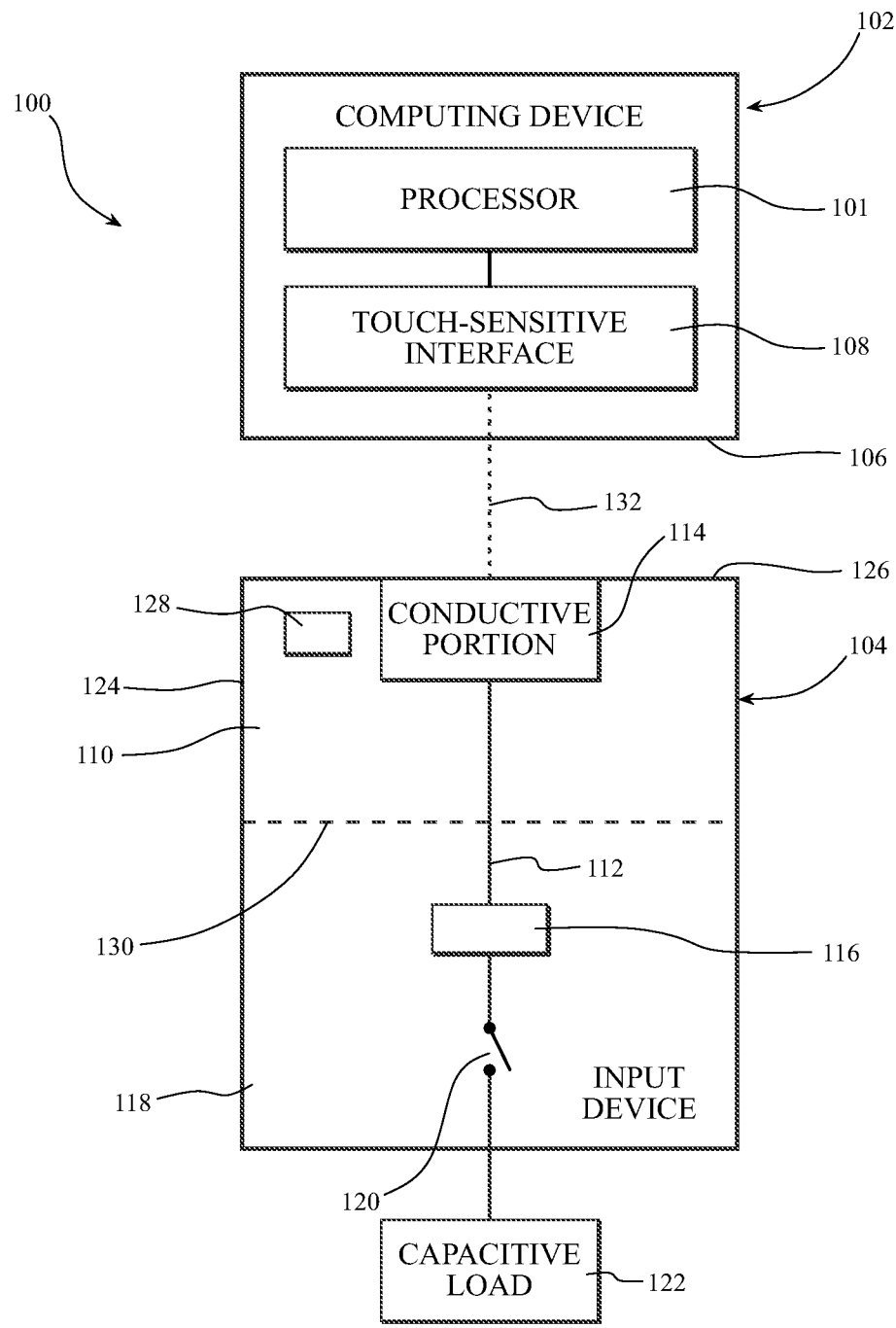
FIG. 1 shows a block diagram of a computing device and input device assembly according to an embodiment of the present disclosure.

While the embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION

The present description provides examples, and is not limiting of the scope, applicability, or configuration set forth in the claims. Thus, it will be understood that changes can be made in the function and arrangement of elements discussed without departing from the spirit and scope of the disclosure, and various embodiments can omit, substitute, or add other procedures or components as appropriate. For instance, methods described can be performed in an order different from that described, and various steps can be added, omitted, or combined. Also, features described with respect to some embodiments can be combined in other embodiments.

Computing devices, including touch screen devices such as, for example, tablet computers and smartphones, are widely used and are valuable tools for communication, viewing content, working, recreation, and so forth. Input can be provided to the computing device using a touch-sensitive interface. A touch-sensitive interface, as used herein, refers to a display screen that includes touch- or near-touch-sensitive sensors in the device, wherein when a user contacts the surface of the device with a capacitive load source, the device can detect the presence of the capacitive load source. For example, a touch-sensitive interface can be a capacitive touch-sensitive interface using a surface capacitive touch screen, a projected capacitive touch screen, a surface acoustic wave (SAW) touch screen, related technologies, and combinations thereof. A capacitive load source, as used herein, refers to a device or person that can be detected by use of the touch-sensitive interface. For example, a capacitive load source can be a user's appendage (e.g., finger), a charged stylus, another electrically absorptive instrument, a connection to electrical ground or a virtual ground, a capacitive grounding element, related devices, and combinations thereof. In some embodiments, a mutual capacitance touch screen can be used, wherein the capacitive load source can be detected by the touch screen due to electrical absorption of the instrument to locally reduce the charge in an electrically charged layer of the touch screen.

Although the touch-sensitive interface of a touch screen device is versatile and can simulate a keyboard (e.g., by creating a "virtual" software-based keyboard in the display screen for the user to type on), the flat, hard surface of the touch screen and the low angle at which the touch-sensitive interface is oriented can make typing on the device less desirable than on a peripheral keyboard device. The keyboard and the typist's hands can also take up and cover a significant amount of usable space on the touch screen.

As compared to a virtual on-screen keyboard, a peripheral keyboard accessory can have mechanical switches for the keys that provide a different tactile feel and audible feedback and can be oriented at a more comfortable angle since it is movable relative to the screen. In some cases, the mechanical switches (e.g., collapsible domes or spring-loaded switches) can have mechanical supports such as butterfly or scissor switch guides. The peripheral keyboard also takes up less, if any, display screen space. However, most peripheral keyboards require a wired or wireless connection to the touch screen device. A wired connection can complicate the design of the touch screen device since power and space in the device is needed for components that produce or read the signals coming from the peripheral keyboard. Those components can also drain the power source of the touch screen device while active. A wireless connection to a peripheral device requires an independent power source in the peripheral device and a wireless interface on the touch screen device, both of which add to the cost and energy consumption of the pair.

Aspects of the present disclosure relate to a peripheral input device (e.g., a keyboard, controller, or related accessory) using remote capacitive load transmission to enable the user to interact with a touch-sensitive interface (e.g., a touch screen interface) of the touch screen device without having to move a capacitive load source into physical contact with the touch-sensitive interface. In a non-limiting example, a user can type on a keyboard that is attached to the touch screen device, and the touch screen device can effectively receive input via electrodes in the keyboard as if a user's fingers were touching the touch-sensitive interface. In another example, the user can press a key on the keyboard that enables an electrical connection between a capacitive load (e.g., a connection to ground or a source with low impedance to ground) and electrodes at the touch-sensitive interface to simulate the user's touch without actually transferring the user's capacitive load to the interface. In either case, the user can type at a comfortable angle and with the tactility and audible feedback that cannot be provided by a flat, hard touch screen. Additionally, the keyboard does not need to draw any power from the device or have a power source of its own.

Electrical loads or signals can be transferred through passive (i.e., non-electrically charged) conductive paths in the input device from the capacitive load source to the touch-sensitive interface of the touch screen device in order to simulate interaction between the capacitive load source and the touch-sensitive interface. In this manner, the input device does not need its own power source since it acts as a passive electrical conduit between the capacitive load source and the touch-sensitive interface. The touch of the capacitive load source against a key on the input device adds a capacitive load to one end of the conduit that is transferred to the other end of the conduit that is positioned adjacent the touch-sensitive interface. The touch-sensitive interface can detect the change in capacitive load and react as if the capacitive load source had contacted the touch-sensitive interface directly.

The touch screen device is also not required to provide additional power and circuitry to make an electrical connection to the input device (e.g., a wired connection). The same touch-sensitive interface of the touch screen device can be used for receiving input from the capacitive load source via the input device and from normal user interaction with a capacitive load source directly against the touch-sensitive interface.

In some embodiments, the input device is attached to the touch screen device in a manner partially covering the display screen. In other embodiments, the input device contacts the touch screen device on a touch-sensitive interface of the touch screen device without covering the display screen. For example, a bezel or side portion of the front of the touch screen device can be configured with a touch-sensitive interface portion that can be connected to the input device. The back of the device can also have the touch-sensitive interface. Thus, in various configurations, the input device can access touch-sensitive interfaces on the device that are separate from the display screen.

In some embodiments, the input device can be removably attachable to the touch screen device. In one case, the input device is held to the touch screen device by magnets, clips, straps, or other housing or case portions attached to the keyboard that help orient the input device relative to the touch screen device and help to keep the input device in proper alignment with the touch-sensitive interface. The touch screen device can be configured with sensors or switches that detect the presence of the input device. In this manner, the touch screen device can include software such as a user interface that reacts to the presence of the input device. For example, when keyboard input is needed on the touch screen device, the touch screen device can determine whether or not an on-screen keyboard is displayed based or whether or not the input device is present. In some cases, such as when the input device partially covers the display screen, the user interface can be modified based on the covered screen space to avoid having information obscured from the user.

The input device can be part of a cover or case for the computing device, wherein the input device has portions or sections that are hinged or foldable relative to each other and can be movable between an input position where the keyboard portion and display screen of the device are accessible and visible for typing and a position wherein at least the display screen is covered and the input device is stored.

Additional detail and embodiments are shown in the figures and described below. FIG. 1 is a block diagram illustrating the relationship of a system 100 of a computing device 102 and an input device 104. The computing device 102 can have an external surface 106 and a touch-sensitive interface 108. The input device 104 can be removably coupled to the computing device 102, wherein a contact section 110 of the input device 104 contacts or is in close proximity to (e.g., a few millimeters or less removed from) the external surface 106 of the computing device 102. The input device 104 can include a set of conductive traces 112. In one embodiment, 26 or more conductive traces are included. Alternatively, 60 or more conductive traces can be included. For simplicity, only one of the conductive traces 112 is shown in FIG. 1. The conductive trace 112 can have a first conductive portion 114 located in the contact section 110 and a second conductive portion 116 located in an input section 118 of the input device 104. In some embodiments, the second conductive portion 116 can be connected to a switch 120 that selectively provides a connection between the second conductive portion 116 and a capacitive load source 122.

The system 100 can be referred to as an assembly of the computing device 102 and the input device 104. The input device 104 can be removably attached to the computing device 102 and, when attached, can be held against or latched to the computing device 102. The computing device 102 can be any type of electronic device configured to receive input via a touch-sensitive (e.g., capacitive-load-sensitive) interface. For example, without limitation, the computing device 102 can include, but is not limited to, personal computers (including, for example, computer "towers," "all-in-one" computers, computer workstations, notebook computers, laptop computers, and related devices), graphics tablets, smart watches, other wearable devices, vehicles and related components and accessories, servers, screens, displays, and monitors, photography and videography equipment and related accessories, printers, scanners, media player devices, point-of-sale equipment, home automation equipment, and any other electronic device that uses, sends, or receives human input or that can use a keyboard or a related device for input. Thus, the example tablet computer shown in the figures should be viewed as merely exemplary of the many different types of computing devices that can be implemented with the input devices disclosed herein. The computing device 102 can comprise a processor 101 (or similar controller) in electrical communication with the touch-sensitive interface 108 and configured to control the computing device 102 in response to receiving signals from the touch-sensitive interface.

The input device 104 can be a peripheral keyboard, accessory, case, or cover for the computing device 102. The outer dimensions of the input device 104 can be similar or equal to the outer dimensions of the computing device 102 in order to facilitate portability of the system 100 of devices 102, 104. The input device 104 can be detachable from the computing device 102 by applying a force to the input device 104 to sever the forces holding together magnetically attracted elements in the computing device 102 and the input device 104. The input device 104 can comprise a keyboard such as a QWERTY (or similar layout) keyboard. The input device 104 can be embodied as a type of keyboard, such as, for example, a keyboard having keys arranged in straight rows, straight columns, straight rows and columns combined, or in another distributed or staggered layout. In certain embodiments, the keyboard can have a greater number of keys, or a fewer number of keys than illustrated in the figures. See, e.g., FIGS. 2-4 and 6-7. The keys can be arranged in multiple different layouts. For example, the keys can be arranged in an ANSI (American National Standards Institute) layout, AZERTY layout, ISO (International Organization for Standardization) layout, Dvorak layout, Colemak layout, or other related configuration. The keys can have a compact layout (such as the compact layout of FIG. 2), a tenkeyless layout, 60% layout, 65% layout, 75% layout, full-size layout, numpad-only layout, or other configuration as needed to meet desired space, cost, and ergonomic considerations. As illustrated herein, the one or more keys may be of different sizes and may be positioned at different locations along the surface of the keyboard.

Figure 2:
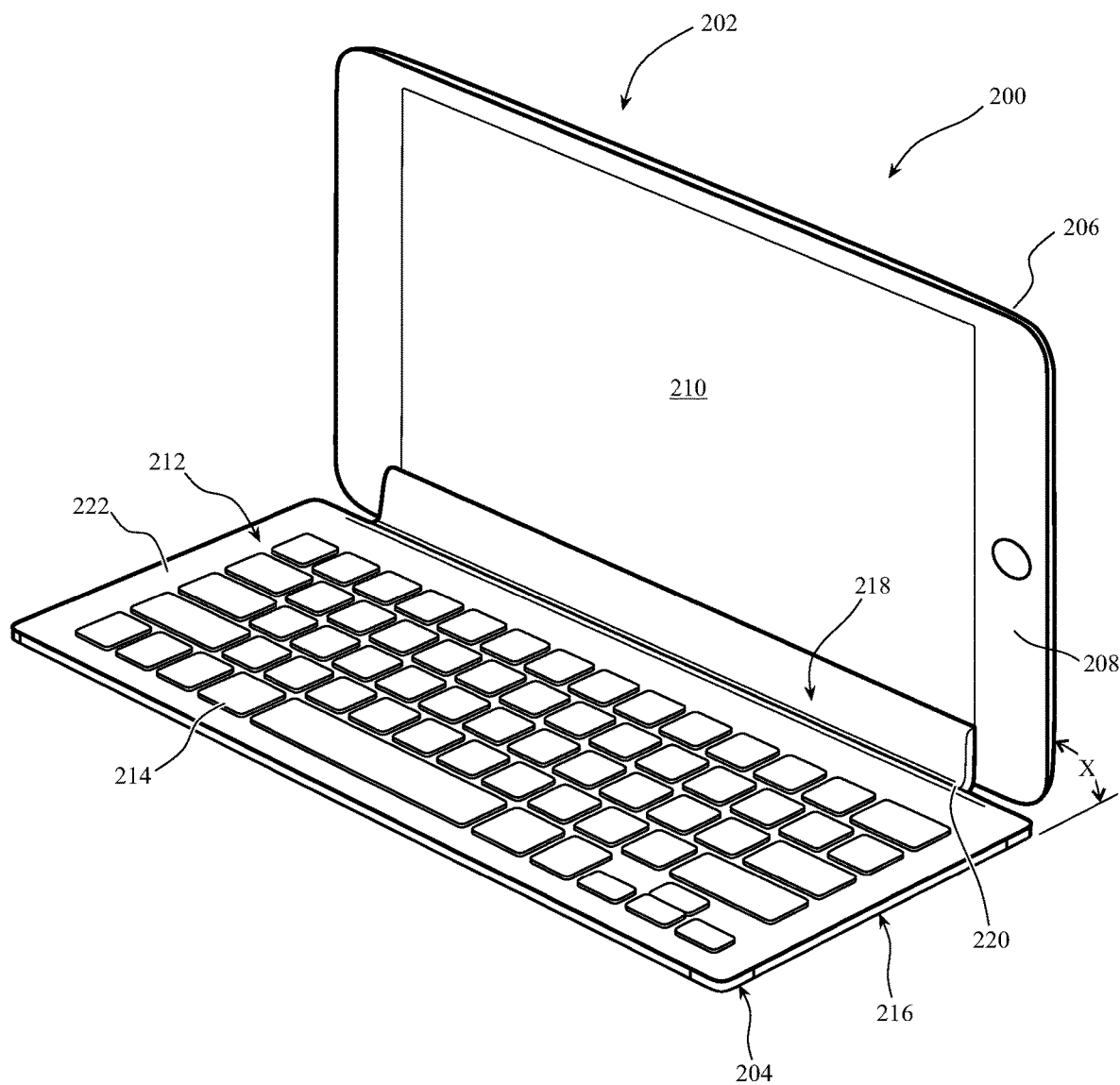
FIG. 2 shows a perspective view of a computing device and an input device according to an embodiment of the present disclosure.

The input device 104 can include a chassis or housing 124 in which the conductive traces 112 are housed or embedded. In some arrangements, the housing 124 can include one or more bendable sections, foldable sections, or hinged sections connected to each other. For example, the contact section 110 and the input section 118 can be connected to each other by a hinge 130. The housing 124 can have an external surface 126 comprising or near the first conductive portions 114 that is configured to face or contact the external surface 106 of the computing device 102. The input device 104 can also include portions (not shown) that are configurable to form a stand or support for the computing device 102. For example, the input device 104 can be configurable to keep the computing device 102 held in an upright position (e.g., as shown in FIG. 2) or at another orientation relative to the input device 104 or relative to a horizontal support surface beneath the assembly.

The external surface 106 of the computing device 102 can be a surface of the device 102 that is adjacent to or external to the touch-sensitive interface 108. The external surface 106 can therefore be a surface through which touch input (e.g., a capacitive load) can be detected by the touch-sensitive interface 108. In some embodiments, the external surface 106 comprises a glass (or other ceramic), polymer, or metal material that, when contacted by a capacitive load source (e.g., a person's finger) can transfer the load to the touch-sensitive interface 108. The external surface 106 can therefore be the outer surface of a display screen of a touch screen interface of the computing device 102 or another front, side, or back surface of the computing device 102 through which a capacitive load can be detected by the touch-sensitive interface 108, or combinations thereof. In some embodiments, the external surface 106 includes a portion of one of the sides of the computing device 102, such as a section of a side of a bezel portion of the front of the computing device 102 or a portion of the rear surface of the computing device 102. The capacitive load source can be detected by the touch-sensitive interface 108 resulting from contact between a conductive pad or lead positioned in the input device 104 and the external surface 106. In some cases, the capacitive load source can be detected by the touch-sensitive interface 108 at a close distance of separation from the external surface 106, such as through thin intermediate layers with appropriate permittivity to allow the capacitive load to be sensed through them (whether the intermediate layers are on the input device 104 or the external surface 106).

The touch-sensitive interface 108 can be any touch-sensitive electronic component configured to receive a capacitive load from a capacitive load source such as a finger or other source having low impedance to ground. For example, the touch-sensitive interface 108 can comprise a mutual capacitive touch sensor array used in touchscreen tablets, phones, and related devices or other touch-sensitive interfaces described elsewhere herein. The touch-sensitive interface 108 can include portions at or near a display screen of the computing device 102 and can extend into portions of the computing device 102 external to or positioned on an opposite side of the device 102 from the display screen.

The contact section 110 of the input device 104 can include the first conductive portions 114 of the conductive traces 112. The contact section 110 can be configured to include the external surface 126 of the housing 124. Thus, the contact section 110 can be arranged in contact with the external surface 106 of the computing device 102. The contact section 110 can also comprise attachment devices 128, such as magnets or fasteners, that keep the contact section 110 removably secured to the computing device 102. The attachment devices 128 can be configured to keep the first conductive portions 114 in a certain position on the external surface 106 of the computing device 102.

The conductive traces 112 can comprise a conductive material (e.g., copper, silver, aluminum, conductive polymer, ceramic material, other conductive material, or combinations thereof) running through the housing 124. The conductive traces 112 can extend through the input device 104, including across a boundary, fold, or hinge 130 between the contact section 110 and the input section 118. In a keyboard configuration of the input device 104, each key can be electrically connected to a different, unique conductive trace 112. Thus, the conductive traces 112 can be insulated from each other so that electrical signals borne by one conductive trace 112 are only transferred to the touch-sensitive interface 108 by that conductive trace 112. As explained in greater detail below, each of the conductive traces 112 can have ends (e.g., the first and second conductive portions 114, 116) located at unique positions on the contact section 110 and on the input section 118. The conductive traces 112 can also be insulated along their lengths between the first and second conductive portions 114, 116 to avoid interference with signal transmission or shorting to other conductive traces, such as by being embedded between insulated layers of material in the housing 124.

A first conductive portion 114 of each conductive trace 112 is positioned in the contact section 110 of the device. In some embodiments, the first conductive portions 114 of the traces 112 can comprise conductive electrodes that are exposed on the surface of the contact section 110 and configured to be external to the touch-sensitive interface 108 and the external surface 106 of the computing device 102. In some embodiments, the first conductive portions 114 are within the housing 124 and are electrically connected to conductive material that links the first conductive portions 114 to the outer surface 126 thereof.

The sensing of a capacitive load at the first conductive portion 114 by the touch-sensitive interface 108 is represented by line 132 in FIG. 1. Line 132 is represented as a dashed line to indicate that there is no wired, conductor-to-conductor connection between the input device 104 and the computing device 102 in order to make the sensing of the capacitive load possible. There is also no powered, two-way wireless communication between the input device 104 and the computing device 102 (e.g., via WI-FI®, BLUETOOTH®, RFID, ZIBGEE®, cellular communication, or another similar wireless communication specification). Instead, the first conductive portion 114 passively reproduces a capacitive load applied to the conductive trace 112, and the computing device 102 senses that load as if the load were applied directly to the external surface 106 without the conductive trace 112 being present.

The second conductive portion 116 can be positioned in the input section 118 of the input device 104. The second conductive portions 116 can be arranged in a keyboard layout in the input section 118. Each of the second conductive portions 116 can be electrically connected to a unique switch 120. Application of a capacitive load to the second conductive portion 116 causes the conductive trace 112 to reproduce the capacitive load at the respective first conductive portion 114.

The input section 118 can comprise a keys, switches, or buttons that can be used to interface with the computing device 102. The input section 118 can be formed in a stiffened portion of the housing 124 so that the keyboard it supports remains flat and supportive of the keys and switches. In some embodiments, the input section 118 has outer dimensions substantially similar to the outer dimensions of the front-facing surface of the computing device 102 so as to completely cover the front-facing surface when the input device 104 is folded or stored against the computing device 102.

The switch 120 connected to the second conductive portion 116 can be an electrical switch such as a momentary contact switch that makes or breaks connection as long as pressure is applied to the switch (e.g., when a button or key connected to the switch 120 is pressed). Once pressure is removed, the switch 120 can return to its original, unpressed position. This functionality can be provided to the switch 120 using a resilient collapsible dome, a spring, a compliant mechanism, or related device that moves a contactor in the switch 120 between a first position enabling electrical conduction through or past the switch and a second position disabling such electrical conduction. In some embodiments, the switch 120 provides a momentary contact for a conductive path starting in a keycap/button (or on the surface of the keycap/button) and extending to the second conductive portion 116, thereby also providing a conductive path to the first conductive portion 114. Accordingly, if a capacitive load source 122 (e.g., a user's finger) presses down on the keycap, the first conductive portion 114 can absorb energy from the touch-sensitive interface 108 (or otherwise apply the capacitive load to it) when the switch 120 enables the conductive path to the first conductive portion 114.

In another embodiment, the switch 120 can provide an electrical connection to a capacitive load source 122 that is not a finger or other instrument applied to the keycap. For example, another capacitive load source can be selectively connected to the second conductive portion 116 by the switch 120. The other capacitive load source 122 can be positioned within the input device 104, such as a relatively large conductive object (relative to the first conductive portion 114) that, when connected to the conductive trace 112, makes the conductive trace have a low impedance to ground, thereby simulating the capacitive load of a finger or other charged instrument against the touch-sensitive interface 108.

Figure 3:
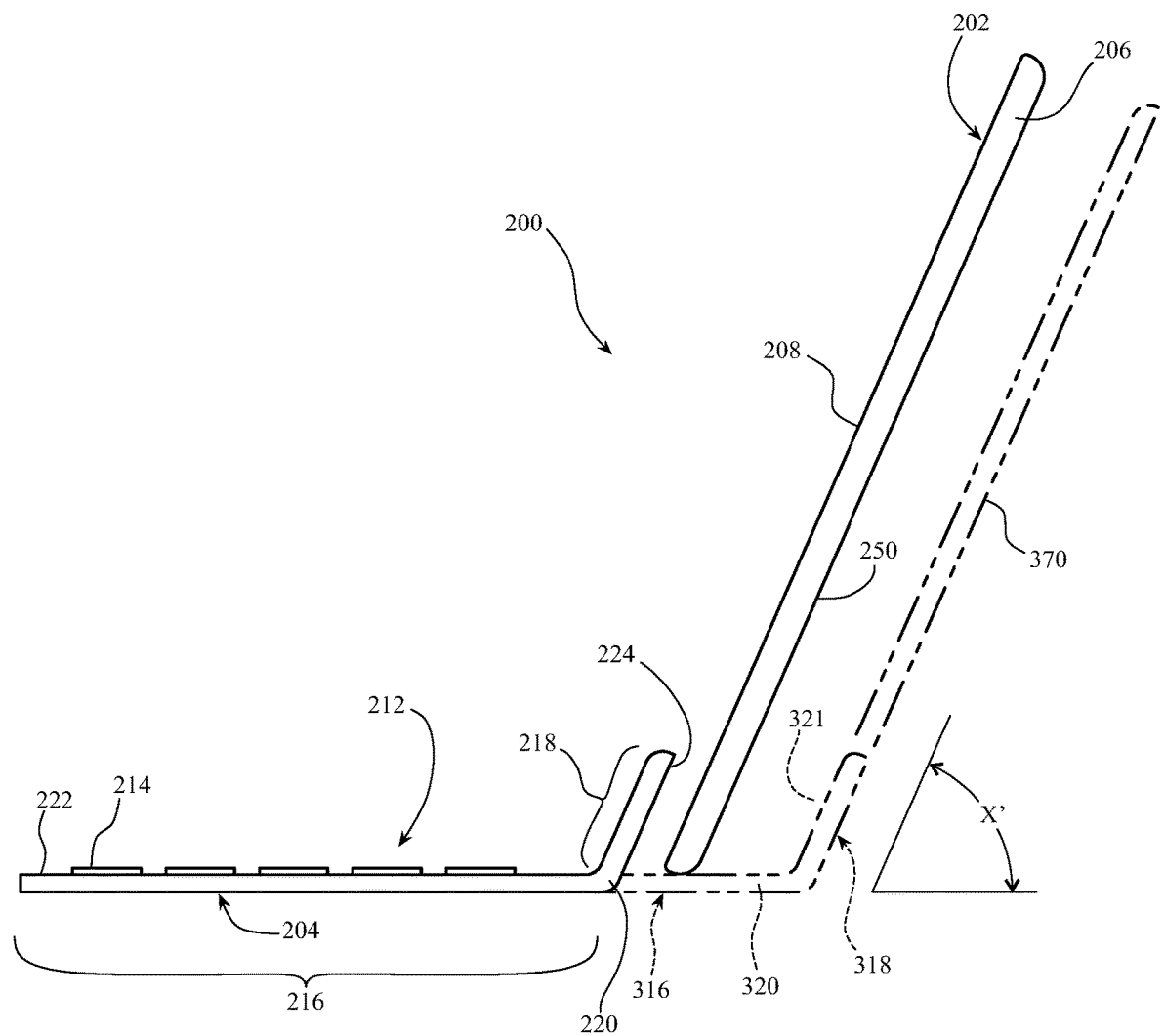
FIG. 3 shows an exploded side view of the assembly of FIG. 2.
Figure 4:
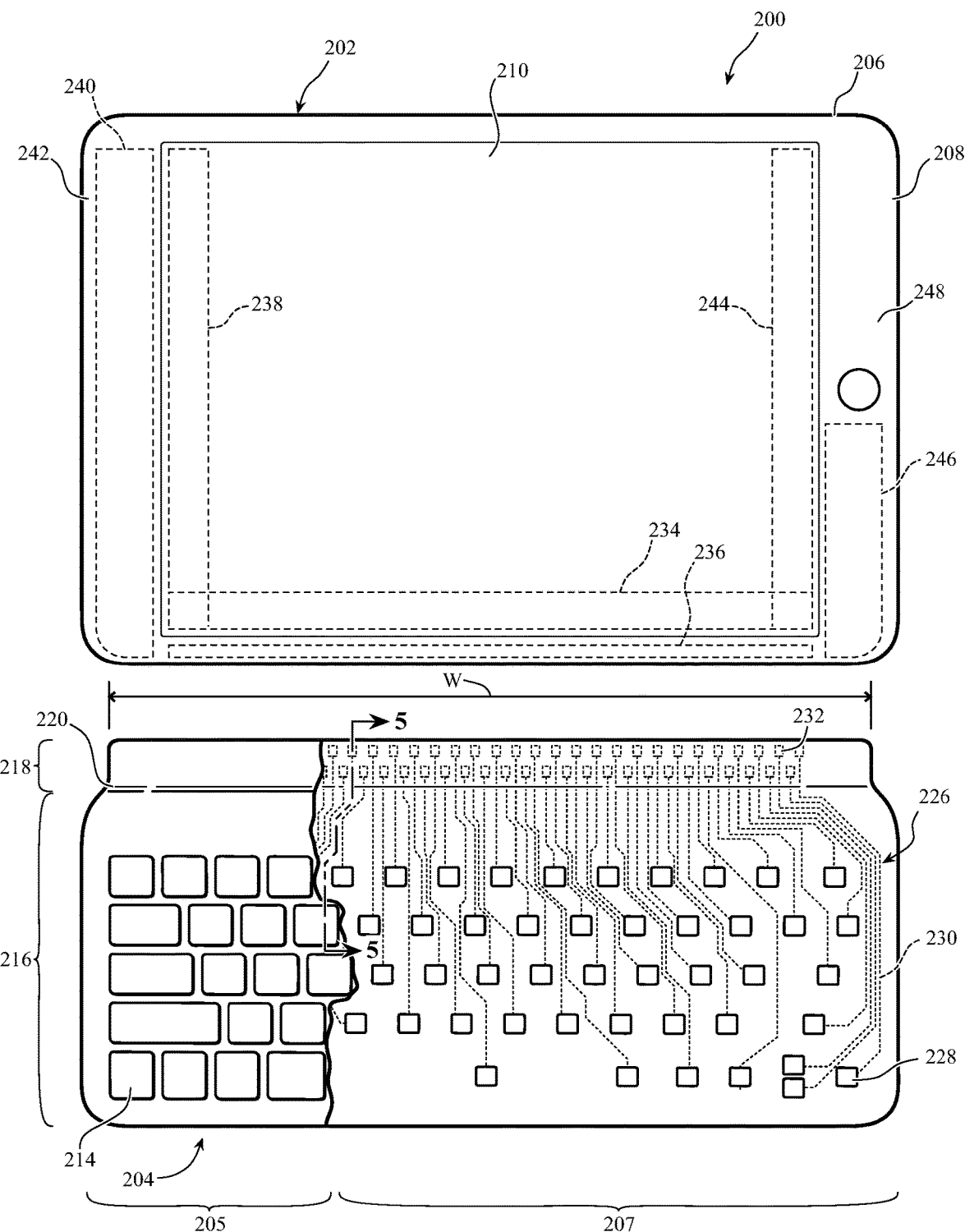
FIG. 4 shows a partial breakaway and exploded front view of the assembly of FIG. 2.

Detail about a related embodiment is shown in FIGS. 2-4. In these figures, a system 200 includes a computing device 202 and input device 204 shown from various orientations and in various degrees of separation. FIG. 2 is a perspective view, FIG. 3 is an exploded side view with the computing device 202 in a different orientation relative to FIG. 2, and FIG. 4 is a partial breakaway and exploded front view with the input device 204 in a different configuration relative to FIGS. 2 and 3. In FIG. 4, a top surface layer and keycaps 214 of the input device 204 are partially removed to show conductive pads (e.g., 228, 232) and to illustrate conductive traces 226 through the input device 204.

In these embodiments, the computing device 202 is a tablet computer having a housing 206 and a front surface 208 through which a user can interact with the device 202 using a touch-sensitive interface which, in this case, is a touch screen 210. The input device 204 is shown with a keyboard 212 including a set of keys 214 arranged in a keyboard layout. The keys 214 can have different shapes and sizes, as shown. Each key 214 can be configured with its own switch (e.g., switch 120; see also FIG. 5 and related description below). The keys 214 can each have a label or glyph (not shown) on their top surfaces.

The input device 204 can have an input section 216 and a contact section 218 linked to each other by a bend, fold, or hinge 220. The input section 216 and contact section 218 can be movable relative to each other at the hinge 220. This can enable the computing device 202 to be oriented at different angles X, X' relative to the input device 204, as illustrated by FIGS. 2 and 3, without the computing device 202 being disconnected from the input device 204.

The contact section 218 can be magnetically attracted to the computing device 202, such as by being attracted to the front surface 208 thereof. In other embodiments, the contact section 218 can be attached to the computing device 202 in another way, such as by being strapped, clipped, or latched onto the computing device 202, being integrated into a case for the computing device 202, or related techniques. The computing device 202 can be configured with sensors (e.g., Hall-effect sensors detecting a magnet in the input device 204) that detect the presence of the input device 204. Detecting the presence of the input device 204 can cause the computing device 202 to change its software settings (e.g., by the processor 101 executing software instructions stored in memory on the computing device).

The input section 216 can have a top surface 222 from which the keys 214 extend and that is configured to face upward. The contact section 218 can have an external surface 224 (see FIG. 3) at which contactors (e.g., first conductive portions 114) can be located. The top surface 222 can comprise a flexible surface layer (not shown) covering the keys 214 or external surface 224 and providing a barrier against debris and moisture penetrating the keys 214, external surface 224, or other space within the input device 204. In some embodiments, the flexible surface layer can comprise a conductive flexible material such as a conductive polymer through which a capacitive load can be transferred to the keys 214 upon touching the flexible surface layer. The flexible surface layer can comprise a set of conductive portions or inserts that each contact a unique key 214. Thus, applying a capacitive load to the conductive portion of the flexible surface layer can enable that load to pass through the flexible surface layer to the key 214 within.

In the configuration shown in FIG. 2, the computing device 202 is arranged with the touch screen 210 where the user can view the touch screen 210 while also being able to view and interact with the keyboard 212 in a normal laptop-computer-like orientation. In embodiments where the input device 204 is integrated with a stand or support for the computing device 202, the input device 204 can be arranged to be configurable in the relative position shown in FIG. 2 while the computing device 202 is also arranged in the relative position shown in FIG. 2.

FIG. 4 shows that the input device 204 can have a set of conductive traces 226 positioned in the input section 216 and contact section 218. In FIG. 4, the keys 214 and top surface 222 are removed from a breakaway portion 207 of the input device 204 to show the location of conductive pads 228 that lie beneath the keys 214. The non-breakaway portion 205 shows the keys 214 in their normal configuration. Each of the keys 214 in the keyboard 212 can have its own unique conductive pad 228 in the input section 216 that is linked to its own unique conductive trace 230 and a unique conductive pad 232 in the contact section 218. Thus, each set of these elements 228, 230, 232 can be a conductive portion of the input device 204 referred to as a conductive trace (e.g., 112) or a conductive lead.

The conductive pads 228 in the input section 216 can be arranged in a keyboard layout. Alternatively, the conductive pads 228 can be replaced by conductive leads that merely connect to the switches of each of the keys 214. Thus, although the conductive pads 228 are shown in FIG. 4 for reference, it will be understood that the pads 228 are merely representative of conductive elements of some kind that are connected to switches in the keyboard 212 and that are connected to the conductive traces 230. Further, the scale and shape of the pads 228 can be modified (e.g., enlarged or reduced in size) to fit the needs of a particular configuration. In some embodiments, the conductive pads 228 are omitted, and a direct connection to an electrical lead on a switch or similar structure is made to the conductive traces 230.

The conductive pads 232 in the contact section 218 can be roughly arranged in a straight row, a set of rows, a straight column, a set of columns, a staggered set of rows (as shown in FIG. 4), a keyboard layout, another comparable pattern, or combinations thereof. The conductive pads 232 can be arranged in rows corresponding to a width between scan rows of a touch-sensitive interface (e.g., electrical paths through touch screen 210). The size of the conductive pads 232 can be configured so that a typical capacitive load (e.g., a capacitive load of a finger) applied through the conductive pads 232 has a sufficient magnitude (when emitted at the conductive pads 232) to be detected by the touch-sensitive interface of the computing device 202. In some embodiments, the size of the conductive pads 232 is therefore configured to simulate the touch of a human finger against the computing device when a capacitive load of a human finger is applied to its corresponding conductive trace 230. The material used in the conductive pads 232 can also affect their size and shape. The conductive pads 232 can be referred to as electrodes or conductors in the contact section 218.

The embodiment of FIG. 4 shows one layout of the conductive pads 232 wherein they are configured to overlay the touch screen 210 in region 234. This region 234 can be referred to as a border region (or a lengthwise border region) of the touch screen 210 since it is located along a border of the touch screen 210 (and is oriented lengthwise relative to the touch screen 210). The width of the border region 234 can be equal to a width W of the portion of the contact section 218 that includes all of the conductive pads 232. Thus, when the contact section 218 is overlaid on the border region 234, all of the conductive pads 232 can be located within the border region 234, thereby enabling all of the keys 214 to be registered at unique locations on the touch screen 210 through the conductive pads 232.

In some embodiments, the conductive pads 232 can overlay a bezel region 236 on the computing device 202. The bezel region 236 is on the front surface 208 and is not part of the display screen but is instead adjacent thereto. Thus, the conductive pads 232 do not cover the touch screen 210, thereby leaving additional uncovered screen space (i.e., the border region 234 is not covered). The computing device 202 can include a touch-sensitive interface (e.g., 108 or 208) that is positioned within (or extends into) the bezel region 236 in this case so that the conductive pads 232 can each be sensed by the interface.

In other embodiments, the conductive pads 232 can be overlaid against the border region 234 and the bezel region 236 simultaneously. This can be beneficial when a large number of (or large size of) conductive pads 232 is implemented in the contact section 218 to avoid taking up additional screen space. In yet other embodiments, the contact section 218 can extend around the touch screen 210 to one or more other portions of the front surface 208, such as to a top border region 238 or top bezel region 240 at a top end 242 of the computing device 202, to a bottom border region 244 or bottom bezel region 246 at a bottom end 248 of the computing device 202, to other regions on the front surface 208 or rear surface 250 (see FIGS. 3 and 6) of the computing device 202, or combinations thereof. Accordingly, the contact section 218 and conductive pads 232 can be arranged to contact any external surface of the computing device 202.

In some embodiments, conductive pads 232 can be positioned on the sides or rear surface 250 of the computing device 202. See, e.g., FIGS. 6-8 and their related descriptions herein.

Figure 5:
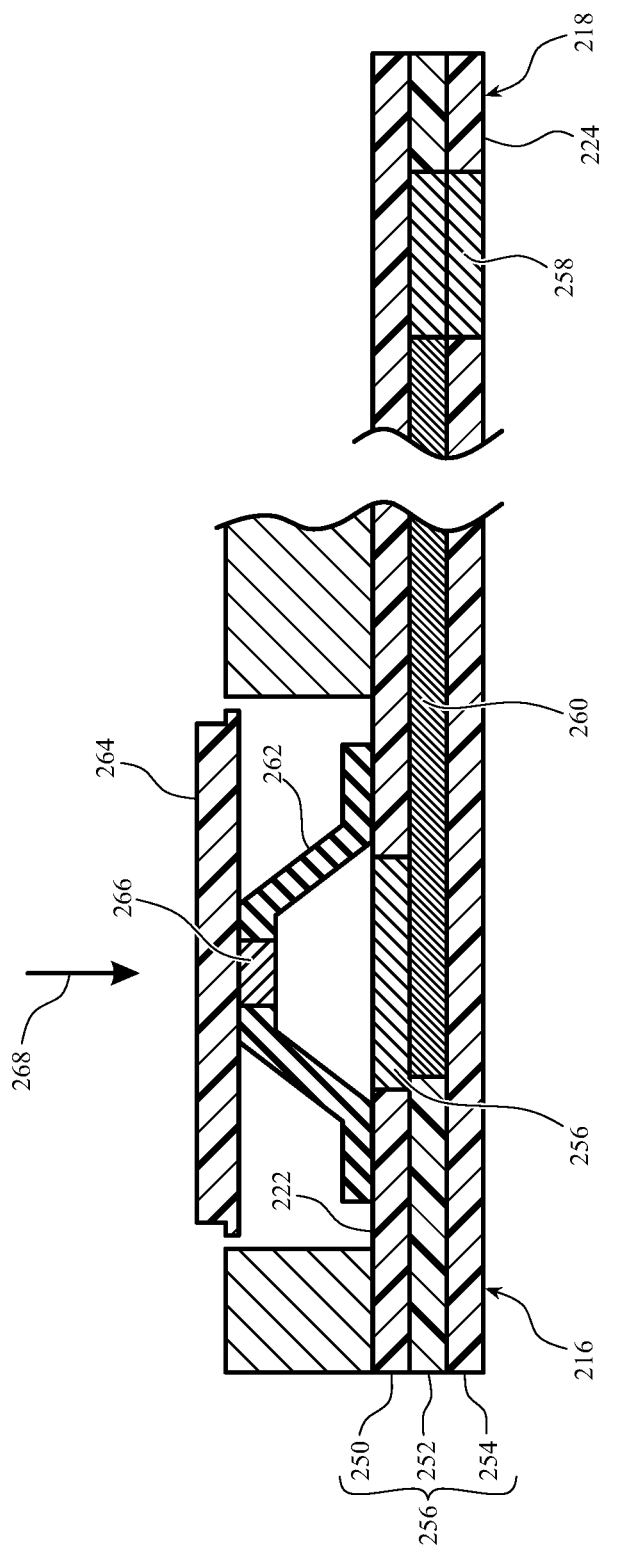
FIG. 5 shows a diagrammatic side section view of the input device of FIG. 2 as taken through section lines 5-5 in FIG. 4.

FIG. 5 is a diagrammatic side section view through the input device 204, as indicated by section line 5-5 in FIG. 4. To facilitate convenient reference, sizes and shapes of components are not shown to scale, and some components are not shown. The input section 216 and contact section 218 can be positioned at opposite ends of the input device 204 and can each comprise a set of layers 251, 252, 254 in a substrate or housing 256.

The housing 256 can comprise a rigid material (e.g., made of a composite such as FR-4 or a comparable material) or a flexible material (e.g., made of thermoplastic polyurethane (TPU), silicone, reinforced silicone, thin sheet metal, a bendable polymer, or a comparable material) for the layers 251, 252, 254. The housing 256 can include the embedded conductive traces 226 positioned through the layers 251, 252, 254. For example, a conductive switch pad 256 can be positioned in the top layer 251, a conductive electrode pad 258 can be positioned in the bottom layer 254, and a conductive trace 260 can electrically connect the switch pad 256 to the electrode pad 258 through the middle layer 252. The switch pad 256 can be one of the conductive pads 228, the electrode pad 258 can be one of the conductive pads 232, and the conductive trace 260 can be one of the conductive traces 230 of FIG. 4. See FIG. 4. In some embodiments, the layers 251, 252, 254 can be covered by an additional coating or layer through which a capacitive load coming from the conductive elements can be detected.

In some embodiments, only two layers 251, 254 are provided, and the conductive trace 260 can be embedded between them. In another embodiment, all of the layers 251, 252, 254 may be formed as a single layer with the pads 256, 258 and conductive trace 260 embedded therein.

A switch 262 can be positioned at the switch pad 256. The switch 262 can comprise a corresponding keycap 264. The keycap 264 can be one of the keycaps 214 of FIGS. 2-3. The switch 262 can comprise a conductive portion 266, and the keycap 264 can comprise a conductive material in contact with the conductive portion 266. Accordingly, when a capacitive load is applied to the keycap 264, the conductive path through the keycap 264 and the conductive portion 266 can transfer the capacitive load to the inside of the switch 262. The switch 262 can be collapsible to a position (not shown) where the conductive portion 266 contacts the switch pad 256. This can occur when a user presses down on the keycap 264 in the direction of arrow 268. Thus, the capacitive load can be transferred from the keycap 264 to the electrode pad 258 via the conductive portion 266, switch pad 256, and conductive trace 260. Accordingly, if the electrode pad 258 is within an operative, detectable distance from a touch-sensitive interface (e.g., 108), the capacitive load applied at the keycap 264 can be registered or detected by the interface.

The switch 262 can be a collapsible dome, an inverted collapsible dome, a mechanical switch (e.g., an elastically movable contactor-based switch), or a related switch used in keyboards. The switch 262 can provide tactility, feedback, resistance, and sound to the operation of the keyboard 212. The switch 262 can be supported by a housing (e.g., a rigid housing, plate, flexible membrane, and related elements), a stabilizer (e.g., a scissor mechanism or butterfly mechanism), and other components used in keyboards. These features can help resist the ingress of debris or fluids into or around the switch 262, can help prevent accidental dislodgement of the keycap 264 from the switch 262, can improve aesthetics, can help ensure parallel motion of the keycap 264 relative to the top surface 222 (i.e., support the keycap 264 so that its top surface remains parallel to the top surface 222 while in motion), and can perform other functions to improve the look, feel, and function of the keyboard 212. If a coating or layer covers the keycap 264 or is positioned between the keycap 264 and the switch 262, the coating or layer can include a conductive material or a conductive portion to preserve the conductive path from the user's hand to the electrode pad 258. The coating or layer covering the keycap 264 can also be used as a shield to insulate conductive material in key switches (e.g., conductive portion 266) within the input device 204 and to thereby limit or prevent registration of accidental key presses caused by incidental or inadvertent contact between a finger and the keycap 264. Thus, the conductive path can extend from a ground to an electrode pad (e.g., 458) in the input device. See also FIGS. 7 and 8 and their related descriptions below.

If the switch 262 is a dome switch, it can comprise a conductive metal dome, a flexible dome having a conductive insert, a conductively-doped rubber dome, a conductively-doped silicone dome, or another conductively-doped flexible material. Thus, the switch 262 can provide a conductive path in various ways. In some embodiments, the conductive path from the keycap 264 does not extend through the switch 262, but movement of the switch 262 enables the conductive path to be connected between the keycap 264 and the switch pad 256. For example, the switch can support the movement of the keycap 264 between a first position disconnected from the switch pad 256 and a second position where the keycap 264 (or an extension thereof) is in conductive contact with the switch pad 256.

In yet other embodiments, the switch 262, keycap 264, and supports and coverings for the switch 262 and keycap 264 can be omitted. In this case, the user can directly contact the switch pad 256 with their finger or another capacitive load. Alternatively, the keycap 264 can be omitted, and the user can directly touch the switch 262. Still further, the switch 262 can be omitted and the keycap 264 can be in constant contact with the switch pad 256. Thus, the switch 262 and keycap 264 are not required for operation of the input device 204. In some embodiments, a first set of conductive pads 228 can have corresponding switches 262 and keycaps 264, another set of pads 228 can have only switches 262 or only keycaps 264, and another set of pads 228 can have neither switches 262 nor keycaps 264.

Figure 6:
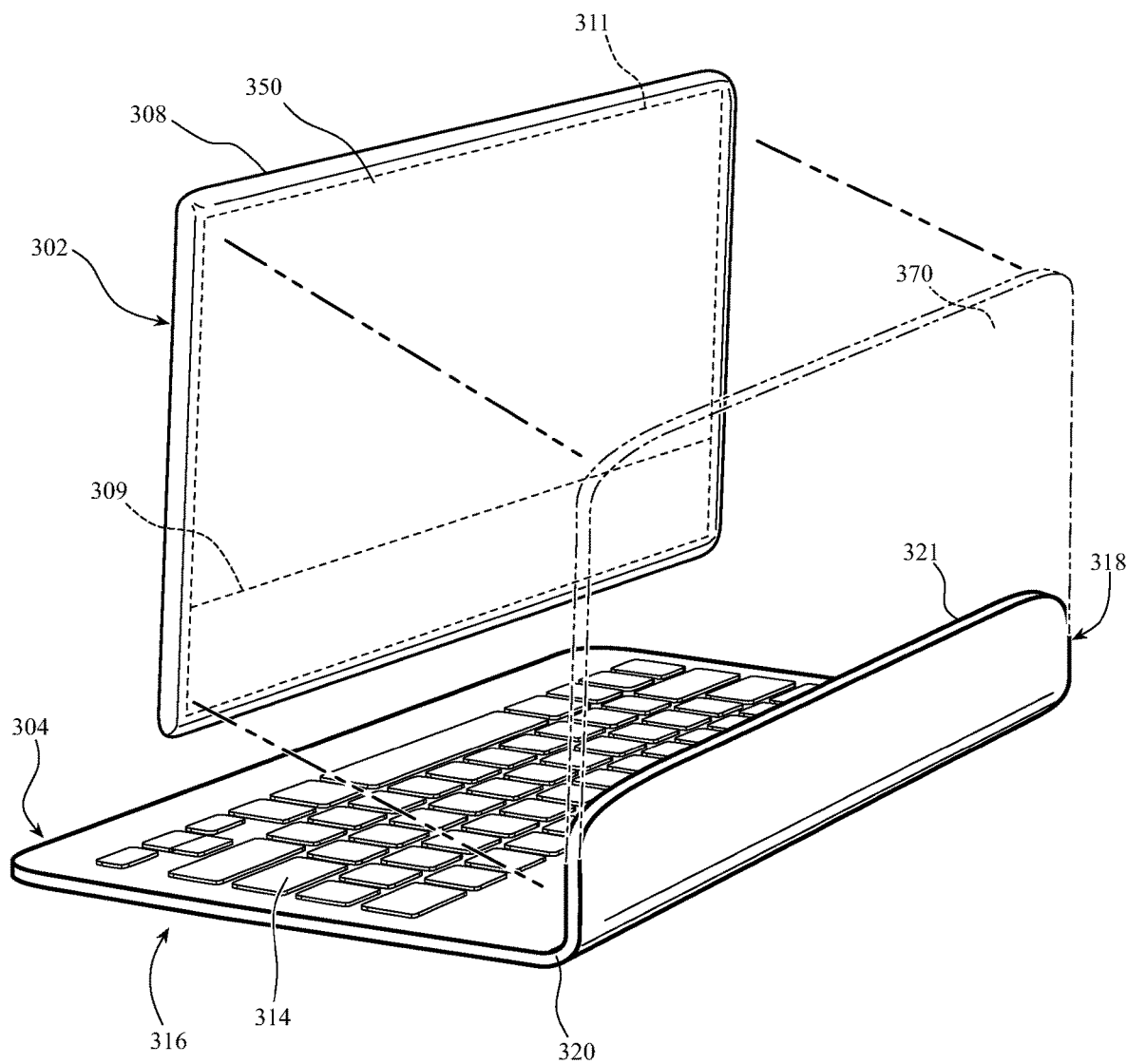
FIG. 6 shows an exploded perspective view of an embodiment of a computing device and an input device according to another embodiment of the present disclosure.

FIGS. 3 and 6-8 illustrate additional embodiments of the input device 304 wherein the input device 304 is configured to contact a back or rear surface 350 of the computing device 302. As shown in FIGS. 3 and 6, the input device 304 can comprise an input section 316 and a contact section 318 with a hinge 320 that is positionable underneath the computing device 302 when the computing device 302 is in an upright orientation relative to a horizontal direction. The contact section 318 can have a front-facing surface 321 configured to contact a rear-facing surface 350 of the computing device 302. The rear-facing surface 350 can therefore comprise a touch-sensitive interface 309 corresponding to the front-facing surface 321 in size and position. Accordingly, the input device 304 can transfer capacitive load from the keys 314 to the touch-sensitive interface 309 via conductive leads similar to the traces 226. Conductive pads similar to pads 232 can be positioned on the front-facing surface 321 to enable this interaction. In some embodiments, the rear surface 350 can be configured with a material through which a capacitive load can be locally transferred, such as, for example, a glass or polymer material.

The input device 304 can be foldable or bendable at the hinge 320. Accordingly, the input section 316 can be folded to cover the front surface of the computing device 302 while the contact section 318 is positioned against the rear surface 350. In that configuration, the keys 314 can face toward or contact the front surface of the computing device 302, and the computing device 302 itself can help protect and cover the keys 314.

The touch-sensitive interface 309 can be part of a touch-sensitive interface that is used to detect touch input on a display screen on the front surface 308 of the computing device 302. The touch-sensitive interface for the display screen can extend through the interior of the computing device 302 from the front surface 308 to the region for the touch-sensitive interface 309 shown in FIG. 6. For example, the interface for the touch screen can wrap around or fold within the inside of a housing of the computing device 302 to provide touch-sensitivity at the rear surface 350. Alternatively, the touch-sensitive interface 309 can be a separate component from any touch interface of the front surface 308.

In some embodiments, the touch-sensitive interface 309 can be touch-sensitive, wherein contact with a finger against the touch-sensitive interface 309 can be detected by the computing device 302. In some of these configurations, the computing device 302 can be configured with software that ignores or disables touch interaction with the rear touch-sensitive interface 309 unless the presence of a contact section 318 is also detected (e.g., by a Hall-effect sensor detecting magnets in the contact section 318 at the rear surface 350).

Referring again to FIGS. 3 and 6, the contact section 318 can be configured to cover or extend along an edge or bezel portion of the rear surface 350 of the computing device 302. In some embodiments, a contact section 370 can be enlarged relative to contact section 318, wherein the contact section 370 extends across a majority or entirety of the rear surface 350 of the computing device 302. In such an embodiment, the contact section 370 can have conductive pads distributed across its entire front surface 321 to interact with a large touch-sensitive interface 311 through the rear surface 350. In some configurations, the contact section 370 can still have conductive pads localized enough to interact with a smaller touch-sensitive interface (e.g., 309) that is substantially smaller in area than the area of the front surface 321 of the contact section that is in contact with the rear surface 350 of the computing device.

Figure 7:
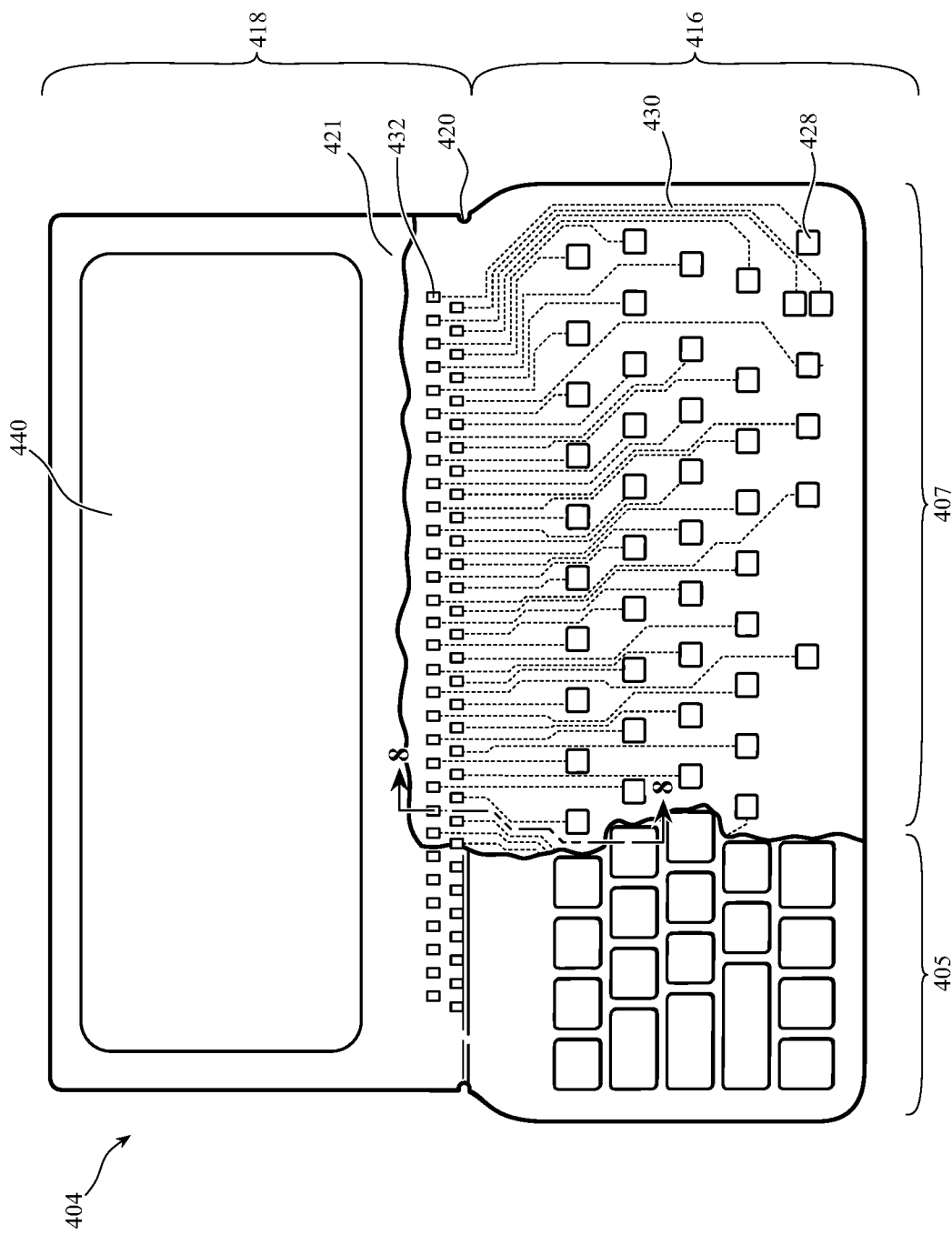
FIG. 7 shows a partial breakaway front view of an embodiment of an input device of the present disclosure.

FIG. 7 illustrates an example embodiment of an input device 404 configured with a large contact section 418. This input device 404 can have similar features in its input section 416 as the input section 216 shown in FIG. 4 with its pads 428 and traces 430. FIG. 7 is also shown with a breakaway section 407, wherein keycaps and other upper portions of the input device 404 are removed to reveal inner conductive elements of the input device 404, and a non-breakaway section 405 showing a normal top view of the input device 404. In this view, the breakaway section 407 does not extend to the large conductive pad 440. The conductive pads 432 may differ from conductive pads 232 by being on a top surface/front-facing surface 421 of the contact section 418. Being positioned on the front-facing surface 421 of the contact section 418 can permit the pads 432 to contact a rear surface of an electronic device (e.g., 350).

The contact section 418 can also comprise a large conductive pad 440 that is larger than, and insulated from, the other conductive pads 432. The large conductive pad 440 can be referred to herein as a virtual ground pad, a low impedance to ground pad, or a capacitive ground pad. The increased size of the large conductive pad 440 can make it have a low impedance to ground (relative to the smaller conductive pads 432) and thereby make it act as a virtual ground when instantaneously electrically connected to the smaller conductive pads 432. It can also be connected to, or replaced by, an external ground source (e.g., a wire to ground (e.g., via a power cable for the computing device 302) or a grounded conductive surface of the computing device 302). The large conductive pad 440 can be capacitively coupled to the system ground of the electronic device chassis through any insulating material positioned between the pad 440 and the ground within the computing device 302. The large conductive pad 440 can therefore be referred to as a capacitive load source contained within the input device 304. The large conductive pad 440 can be designed to have a larger size relative to the smaller conductive pads 432 wherein if both types of pads 432, 440 are in contact with a dielectric surface (e.g., an anodized aluminum body on the computing device or the like), the larger pad 440 will be sized to induce a sufficient capacitive load to be detectable by the touch-sensitive interface of the computing device when that load is transferred to one of the smaller pads 432. In this manner, electrically connecting the large conductive pad 440 to one of the other conductive pads 432 can give the same electrical effect as a finger precisely touching one of the other conductive pads 432. In some embodiments, there is no direct DC connection to the system ground, the potential at the other conductive pads 432 is electrically equivalent to ground due to the high capacitance made by the large conductive pad 440 and the chassis of the computing device.

The larger pad 440 can be selectively electrically connected to each of the conductive pads 428 in the input section 416 or to each of the conductive pads 432 in the contact section 418. The connection can be enabled or disabled by switches (e.g., switch 462 in FIG. 8) in the input device 404.

Figure 8:
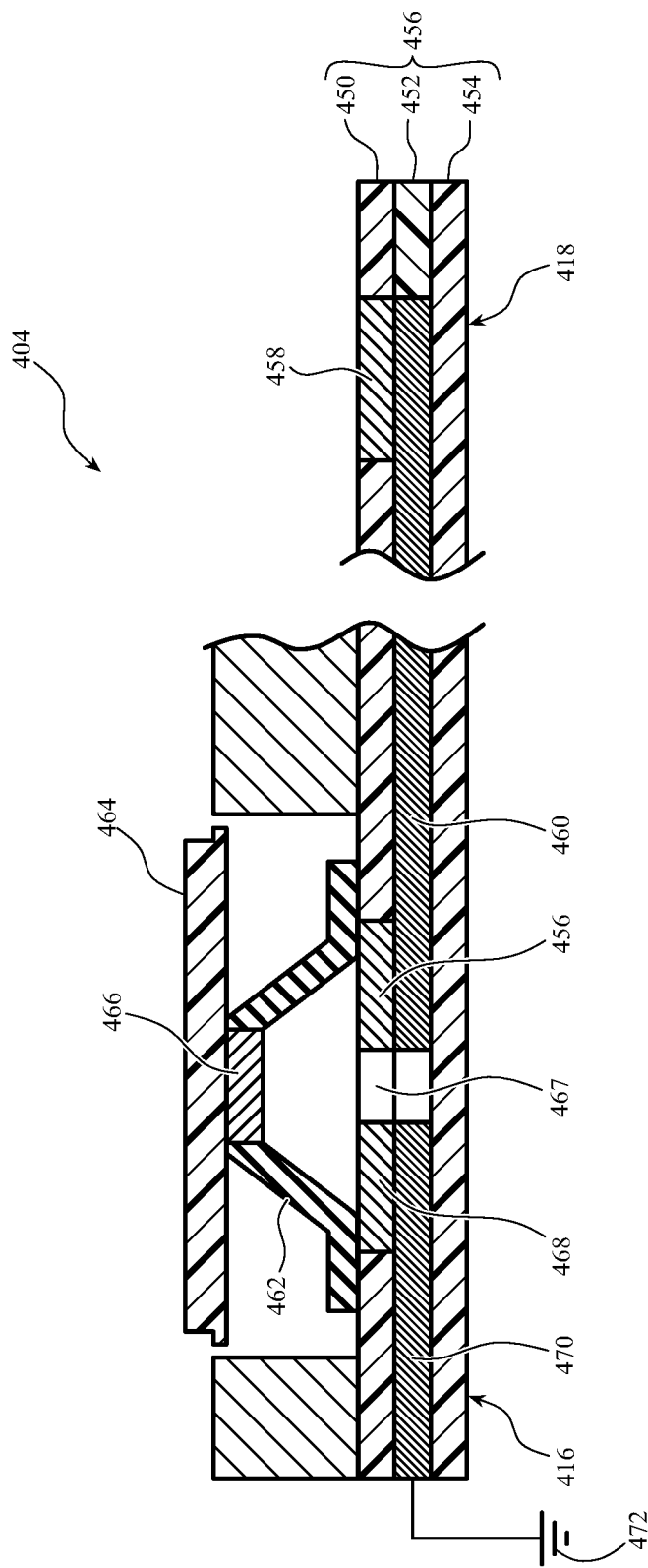
FIG. 8 shoes a diagrammatic side section view of the input device of FIG. 7 as taken through section lines 8-8 in FIG. 7.

FIG. 8 is a diagrammatic side section view of an embodiment of input device 404, as suggested by section line 8-8 in FIG. 7. To facilitate convenient reference, sizes and shapes of components are not shown to scale, and some components (e.g., a possible mechanical stabilizer for keycap 464) are not shown. The input section 416 and contact section 418 can be positioned at opposite ends of the input device 404 and can each comprise a set of layers 450, 452, 454 in a substrate or housing 456. The housing 456 can have the properties of housing 256.

The housing 456 can include embedded conductive traces positioned in the layers 450, 452, 454. For example, a conductive switch pad 456 and a conductive electrode pad 458 can be positioned in the top layer 450, and a conductive trace 460 can electrically connect the switch pad 456 to the electrode pad 458 through the middle layer 452. The switch pad 456 can be one of the conductive pads 428, the electrode pad 458 can be one of the conductive pads 432, and the conductive trace 460 can be one of the conductive traces 430 of FIG. 7.

In this embodiment, the external surfaces of the keycap 464 can be non-conductive. Thus, contact with a finger against the keycap 464 would not transfer a detectable capacitive load through the input device 404 to the electrode pad 458. Instead, the switch 462 can comprise a conductive portion 466 (or can be formed with a conductive material, as explained elsewhere herein), and the conductive portion 466 can move as the switch 462 collapses to complete a conductive path between a second switch pad 468 and the first switch pad 456. The second switch pad 468 can be connected via a conductive trace 470 to a capacitive load source 472 (e.g., large pad conductive 440 or a connection to a ground source or a virtual or relative ground source) and can therefore transfer a capacitive load to the electrode pad 458 without passing through the keycap 464 or without being sourced from a user's appendage or other instrument applied to the keycap 464. The first and second switch pads 456, 468 can be separated by an air gap 467 or insulator that prevents conduction between the first and second switch pads 456, 468 when the switch 262 is not closed. Other types of switches and configurations of conductors and pads can be used as well. For example, the dome of switch 462 can be inverted such that an upward-facing surface of the dome is concave instead of convex.

While reference is made herein to parts and features being "horizontal" and "vertical," it will be understood by those having ordinary skill in the art that these orientations are provided for convenience in describing features of the embodiments disclosed herein and should not be construed as limiting these embodiments to operating only in the orientations shown or described. Thus, although portions of the device are described with reference to vertical or horizontal directions, the devices in the present disclosure can be oriented at any angle.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. A computing device and keyboard assembly, comprising:
    a computing device having a housing containing a capacitance-sensing interface and a display screen;
    a keyboard coupled to the computing device and having:
        an input section;

a coupling section positioned at a detectable distance from the capacitance-sensing interface of the computing device;

a hinge positioned between the input section and the coupling section, the hinge joining the coupling section to the input section; and a set of conductors extending through the hinge, each conductor of the set of conductors comprising:

a first end portion located in the coupling section; and a second end portion located in the input section;

wherein the capacitance-sensing interface of the computing device is configured to detect an application of a capacitive load to the second end portion via the first end portion.

2. The assembly of claim 1, further comprising an intermediate layer positioned between the capacitance-sensing interface and the coupling section.

3. The assembly of claim 1, wherein the capacitance-sensing interface and the coupling section are positioned out of contact with each other.

4. The assembly of claim 1, wherein the capacitance-sensing interface is spaced away from the display screen.

5. The assembly of claim 1, wherein the capacitance-sensing interface is operable at the display screen.

6. The assembly of claim 1, wherein the keyboard is attachable to the computing device in an input position wherein the input section and the display screen are visible and in a stored position wherein the display screen is covered.

7. The assembly of claim 1, wherein the first end portions of the set of conductors are distributed across an edge portion of the computing device.

8. The assembly of claim 1, wherein the computing device is configured to detect a presence of the coupling section of the keyboard at the capacitance-sensing interface.

9. A keyboard, comprising:

a housing having a first section and a second section joined by a hinge, the hinge positioned between the first section and the second section, the first section having an external surface configured to face an electronic device, the second section being configured to extend away from the electronic device; and a set of conductive leads positioned in the housing and extending through the hinge, each conductive lead of the set of conductive leads comprising:

a first conductive portion positioned at the external surface of the first section and configured to be detectable by a capacitance-sensing interface of the electronic device; and a second conductive portion positioned in the second section;

wherein each of the second conductive portions of the set of conductive leads is configured to passively transfer capacitive loads from an external object to respective first conductive portions.

10. The keyboard of claim 9, further comprising a set of switches, wherein each switch of the set of switches is positioned adjacent to a separate second conductive portion of the set of conductive leads.

11. The keyboard of claim 10, further comprising a set of keycaps respectively configured to actuate the set of switches upon application of an input force to the set of keycaps.

12. The keyboard of claim 10, wherein each switch of the set of switches comprises a conductive material capable of transferring capacitive load to a respective second conductive portion of the set of conductive leads.

13. The keyboard of claim 9, further comprising a coating or external layer covering at least one of the first conductive portions.

14. The keyboard of claim 9, wherein the hinge is configured to enable rotation of the first section relative to the second section.

15. A capacitive touch input device, comprising:

a housing having an input portion and a pad portion joined by a hinge, the hinge positioned between the input portion and the pad portion;

a set of conductive traces extending through the hinge from the input portion of the housing to the pad portion of the housing, the set of conductive traces defining a set of passive conductive paths though the housing;

wherein a capacitive load applied at the input portion of the housing is detectable at the pad portion of the housing via passive transfer through at least one of the conductive traces of the set of conductive traces.

16. The capacitive touch input device of claim 15, further comprising a set of keys at the input portion, each of the set of keys respectively corresponding to each of the conductive traces.

17. The capacitive touch input device of claim 15, further comprising a coating or external layer covering the pad portion of the housing.

18. The capacitive touch input device of claim 15, wherein the pad portion comprises a set of conductive pads, each respectively being in electrical communication with the set of conductive traces.

19. The capacitive touch input device of claim 15, further comprising a connection to an electrical ground, wherein the capacitive load is applicable to a conductive trace of the set of conductive traces by electrically connecting the conductive trace to the electrical ground.

* * * * *